United States Patent [19]

Engdahl et al.

[11] 4,124,809

[45] Nov. 7, 1978

[54] QUARTZ CRYSTAL RESONATOR

[75] Inventors: Jean Engdahl, Bienne; Raymond Huguenin, Port, both of Switzerland

[73] Assignee: Societe Suisse pour l'Industrie Horlogere Management Services S.A., Bienne, Switzerland

[21] Appl. No.: 523,829

[22] Filed: Nov. 14, 1974

Related U.S. Application Data

[63] Continuation of Ser. No. 364,266, May 29, 1973, abandoned.

[30] Foreign Application Priority Data

May 30, 1972 [GB] United Kingdom ............... 25307/72

[51] Int. Cl.² ............................................. H01L 41/10
[52] U.S. Cl. .................................... 310/361; 310/320; 310/368
[58] Field of Search ................. 310/8, 8.2, 9.5, 9.6, 310/9.7, 9.8, 360, 361, 368, 320

[56] References Cited

U.S. PATENT DOCUMENTS

| 2,223,537 | 12/1940 | Sykes | 310/9.7 X |
| 2,306,909 | 12/1942 | Sykes | 310/9.7 X |
| 3,483,402 | 12/1969 | Royer | 310/9.5 |
| 3,792,294 | 2/1974 | Royer | 310/9.5 |

*Primary Examiner*—Mark O. Budd
*Attorney, Agent, or Firm*—Griffin, Branigan and Butler

[57] ABSTRACT

A piezo electric resonator member is cut from a quartz crystal in a rotated Y-orientation and arranged for vibration in a thickness shear mode, the member being in the form of a bar elongated along either the X-axis or the Z'-axis having rectangular cross sections in planes parallel respectively to the XZ'- and Y'Z'-planes or XZ'- and XY'-planes. It is provided with metallized layers to serve as electrodes confined to a central zone of the surfaces running in the same direction as the XZ'-plane. The ends of the bar serve as support points.

7 Claims, 21 Drawing Figures

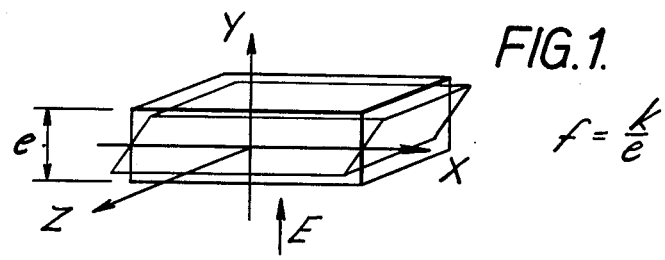
FIG.1.
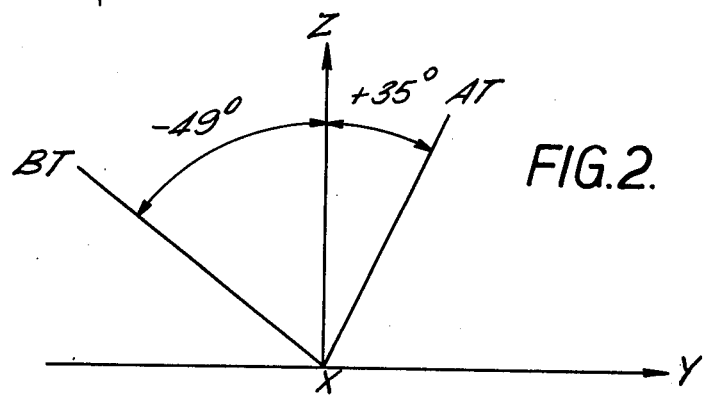
FIG.2.
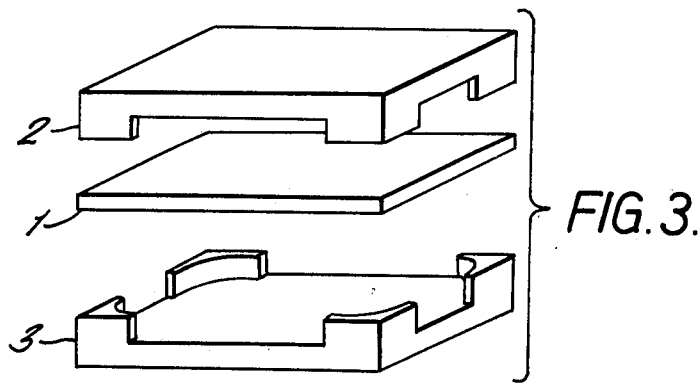
FIG.3.
FIG.4.
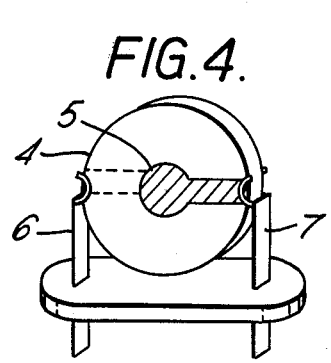
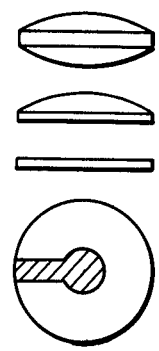
FIG.5a
FIG.5b
FIG.5c
FIG.5d

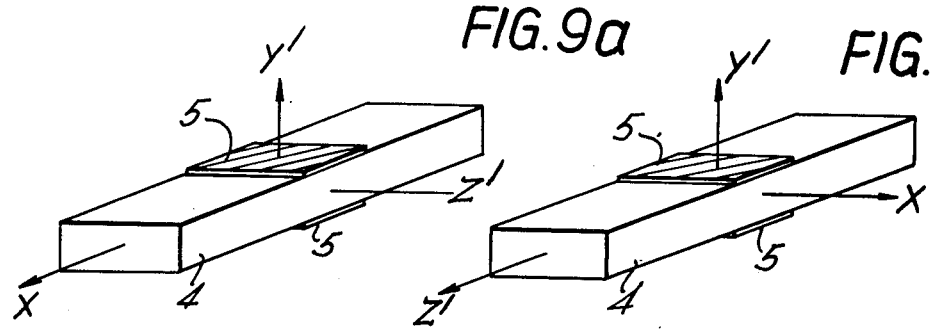
FIG. 9a  FIG. 9b
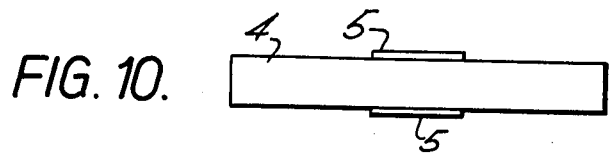
FIG. 10.
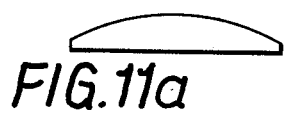  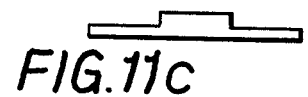
FIG.11a  FIG.11b  FIG.11c
  
FIG.11d  FIG.11e  FIG.11f
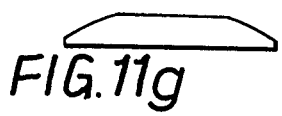
FIG.11g
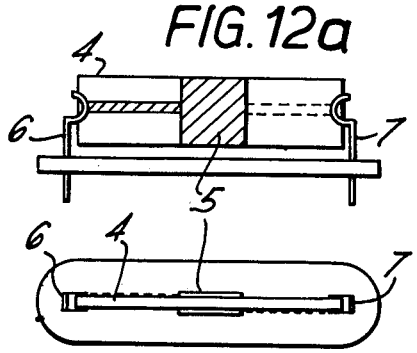 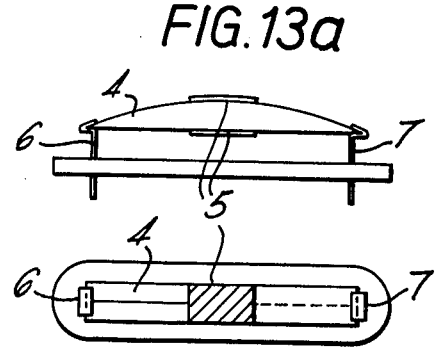
FIG.12a  FIG.13a
FIG.12b  FIG.13b

QUARTZ CRYSTAL RESONATOR

This is a continuation, of application Ser. No. 364,266, filed May 29, 1973, now abandoned.

This invention concerns a new and improved quartz crystal resonator unit and is particularly directed to high frequency resonators, i.e. those operating at frequencies of 1 MHz or higher.

For many years now quartz crystals have found wide-spread use in maintaining fixed frequency standards in a variety of electronic equipment, particularly such items as communications equipment, filters, electronic computers and calculators and the like. In other applications of quartz crystals as a frequency standard are found time-pieces, including most recently, wrist watches. At the present time most such time-pieces operate at relatively low frequencies and while such low frequencies, i.e. 8192 Hz up to 32,768 Hz, provide a standard of time-piece accuracy greatly superior to that hitherto possible in mechanical and earlier forms of electronic time-pieces, it has nevertheless been established that where the practical problems in attaining still higher frequencies can be overcome this accuracy may be further improved. It may be expected for example that with frequencies above 1 MHz, at least a fourfold increase in accuracy should be possible. Various problems however are still in search of a solution. Among such problems is that of producing economically and quickly, to the required degree of accuracy, the quartz resonator unit.

When one is referring to wrist watches it is obvious that all components must be kept as small as possible. In the case of the quartz units hitherto proposed for frequencies higher than 1 MHz these have generally tended to be of a circular lens form. Such forms suffer from various disadvantages including the problem of space occupation and the difficulty of manufacture, including mounting thereof. The general analysis of vibrations in solid bodies when coupling effects and boundary conditions are considered is a problem which thus far has defied solution. Thus for a circular quartz crystal it is not presently possible to determine in advance the nodal point at which suspensions must be attached. In view of the various coupling effects, it can be expected that in many crystals there will be parasitic vibrations which may not be detected until production is well advanced, but which will eventually require that the crystal be rejected. Such lens shaped crystals may also suffer from poor shock resistance in view of a relatively substantial mass.

The present invention takes advantage of recent theories advanced in respect of quartz crystals to propose a solution to the difficulties found in the earlier types of high frequency quartz resonator units.

As is well known quartz resonators are cut from natural quartz crystals according to certain orientations. When a flat parallel faced plate or bar is obtained from a crystal, the term "cut" is used to designate the direction of the normal to the major faces. Thus an X-cut has the normal to its major faces parallel to the X-axis of the crystal. Similarly Y- and Z- cuts have the normals to their major faces parallel to the Y- and Z- axes. It has been found furthermore that certain advantages are gained, particularly in respect of temperature coefficients, through a rotation of the crystal about its X-axis through a predetermined angle. By such means one obtains the well-known AT- and BT-cuts. The resonator proposed by the present invention is formed by just such a rotated Y-cut. Accordingly, when speaking of the axes other than the X-axis, for such a rotated cut, we use the designations Y', Z' to designate the rotated axes.

The invention takes into account a phenomenon first described by Shockley as "energy-trapping," wherein thickness shear vibrations of a quartz plate tend to concentrate under the electrodes and to decrease from there to the edges in an exponential fashion. See for example: W. Shockley, D. R. Curran and D. A. Koneval, "Trapped-Energy Modes in Quartz Filter Crystals" — Journal of the Accoustical Society of America, No. 41, 1967.

For a theoretical approach to the study of vibrations in a lens shaped body, see R. D. Mindlin and M. Forray, "Thickness-Shear and Flexural Vibrations of Contoured Crystal Plates" — Journal of Applied Physics Vol. 25, No. 1, January 1954 or R. P. Jerrard, "Vibrations of Quartz Crystal Plates" — Quarterly of Applied Mechanics No. 18, 1960.

It appears that the energy-trapping principle applies equally to contoured crystals.

It has thus been found that in the presence of a field parallel to the Y-axis there will be produced a shear strain in the XY-plane of greater intensity under the electrodes than elsewhere. This can be considered as a plane wave. Such being the case there is no essential reason to manufacture the quartz in a circular form and from most points of view the form best adapted and most favourable is that of an elongated bar having metallization across its entire width, but confined to a certain portion only of its length.

Accordingly, the invention comprises a piezo electric resonator member cut from a quartz crystal in a rotated Y-orientation and arranged for vibration in a thickness shear mode wherein said member is in the form of a bar elongated along either the X-axis or the Z-axis having rectangular cross sections in planes parallel respectively to the XZ'— and Y'Z'— planes or XZ'— and XY'— planes and is provided with metallized layers to serve as electrodes confined to a central zone of the surfaces running in the same direction as the XZ'— plane.

For a better understanding of the invention reference will now be made to the accompanying drawings in which:

FIG. 1 shows the manner in which under the influence of an electric field a quartz crystal may undergo a thickness shear strain.

FIG. 2 shows how the crystal axes may be rotated to produce the well-known AT- and BT-cuts.

FIG. 3 shows how the earliest quartz were cut and mounted.

FIG. 4 shows one present day form and mounting of quartz crystals.

FIGS. 5a–5d show various forms which are utilized in different frequency ranges.

FIGS. 9a and 9b are perspective views of two forms of a quartz crystal with metallization according to the invention.

FIG. 10 shows how a very high frequency quartz might appear.

FIGS. 11a to g shows possible variations.

FIGS. 12a and 12b and FIGS. 13a and 13b show two possible mounting for the quartz of this invention.

If reference is made to FIG. 1 it may be seen how, if an electric field E is applied along the Y-axis of a quartz crystal plate, a strain is produced of which the principle effect is shearing in the XY-plane. Such a quartz will exhibit frequency variations with temperature as expressed by certain thermal coefficients. Such coefficient may be reduced in value and at certain temperatures even nullified by a rotation of the raw crystal through an angle of + 35° or − 49° about the X-axis when making the cut. Note FIG. 2. A plate thus cut is designated as having respectively an AT- or BT- cut. A specific embodiment of the present invention proposes the use of the AT-cut for which the usual frequency range in the fundamental mode will extend from about 1 MHz to 20 MHz. For this particular cut the frequency constant K is equal to approximately 1670 kHz per mm. Thus the thickness e of the crystal shown in FIG. 1 for an AT-cut would be obtained by dividing this constant by the frequency actually desired. For higher frequencies one may employ the BT-cut for which the frequency constant is approximately 2550 kHz per mm. The first resonator units of this type were square plates which were supported and clamped at their four corners and energized by massive electrodes as shown for example in FIG. 3 where 1 designates a cut plate of quartz, 2 designates an upper electrode and 3 a lower electrode. Such an arrangement proved to be rather unstable in practice and subsequently, quartz units of circular form were adopted. A particular arrangement is shown in FIG. 4, in which 4 designates the quartz, 5 designates an electrode, which can be in the form of a vapour deposited metal layer on the quartz, applied directly to both major surfaces thereof and squeezed between a pair of supporting members 6 and 7 which also serve to connect the quartz into the circuit to be controlled. It has been noted that for low frequencies such units are very poor unless a certain minimum diameter-to-thickness ratio is maintained. It has also been determined that these difficulties diminish to a certain extent when the circumferential edges of the disc are thinned down, so that one can then employ a quartz of smaller diameter relative to the arrangement as shown in FIG. 4. There results a lens-formed quartz for a low frequencies. For a predetermined diameter a bi-convex form as in FIG. 5a is useful between 1 and 3 MHz, a plano-convex form as in FIG. 5b may be used from 3 to 10 MHz and for frequencies above 10 MHz a plane parallel form as in FIG. 5c may be used. In all such cases the quartz units are circular and provided with central electrodes as shown in FIG. 5d.

Figures 6A, 6B:
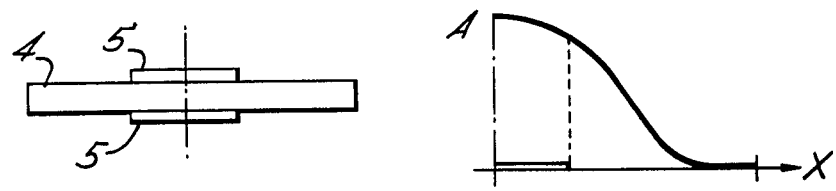
FIGS. 6a and 6b illustrate the energy-trapping principle.

FIG. 6 illustrates the principle of energy-trapping in which with electrodes 5 placed at the centre of a quartz crystal 4 vibrations will be concentrated under the electrodes and will decrease to the edge of the quartz in an exponential fashion as shown in FIG. 6b.

Figures 7A, 7B:
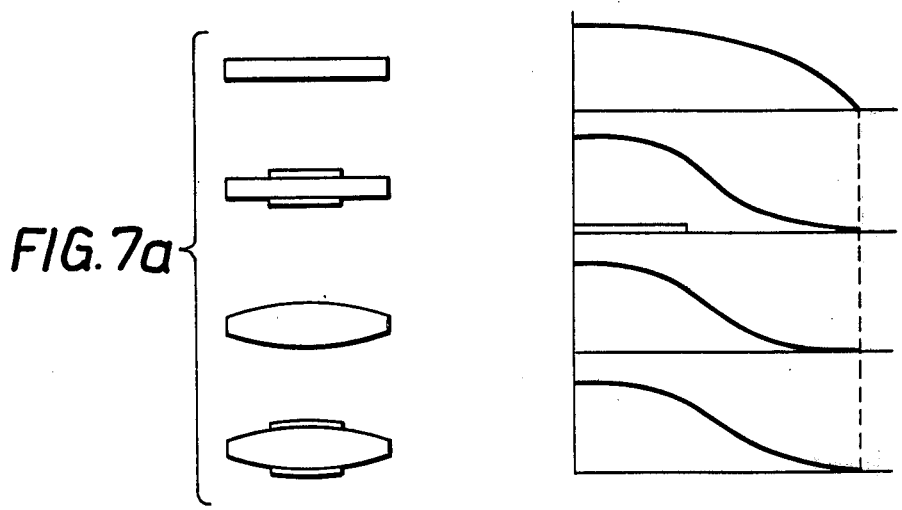
FIGS. 7a and 7b show the effect of electrodes and contouring.

FIG. 7 shows that this same principle also applies to crystals having a lenticular form where FIG. 7a shows two different forms of crystal with and without electrodes and FIG. 7b shows graphically how the vibrations change from the centre to the edge for each of the different forms.

Figure 8:
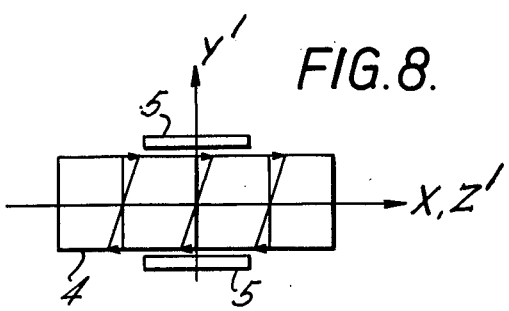
FIG. 8 shows the principle of the invention.

FIG. 8 shows this principle applied to the present invention in which a shear strain arises under the electrodes and such shear is much greater directly under the electrodes than towards the ends of the bar. Accordingly, a form of the invention will be as shown in FIG. 9a or b and 10, in which the crystal 4 is a bar cut in a rotated Y-orientation and electrodes 5 in the form of metallization are applied to the principal surfaces, i.e. parallel to the XZ' plane or the Z'X plane across the entire width of such surfaces. Such electrodes however are confined to a relatively small zone centrally located along the length of such surfaces. By so forming and metallizing the quartz bar the vibratory energy is concentrated at the centre and the ends are practically immobilized and may be considered as nodal points. Such an arrangement is entirely suitable for higher frequency resonators.

For lower frequencies the thickness of the quartz may be increased at the centre.

What has been referred to as energy-trapping comes in fact from a simple phenomenon, viz. the relative missmatch of the centre and the edges of the quartz assures that the natural frequencies of these two zones will be different. Consequently, the form along the XY' plane of FIG. 9a or Z'Y' plane of FIG. 9b seems of little importance and variations of this as shown in FIG. 11a to g are all equally possible. Form a would be the easiest to form by machining processes while form c would lend itself to etching. These various forms may be used on any occasion wherein the metallization (for which the thickness should not be increased without careful consideration) is insufficient to produce the desired difference of mass between the centre and the edges.

Of particular advantage is the form described by FIG. 11g in which the end portions exhibit a cylindrical form whereas the control portion upon which the electrodes are fixed is flattened. In this example the quality factor as obtained from the measurement of the bandwidth characteristic $Q_B$ is found to be equal to that calculated from an equivalent circuit. The design is thereby simplified, which may not be the case with respect to forms a, b, d and e.

In the manner of mounting these crystals it is of course understood that the proportions between length and thickness will have to be chosen in a manner to avoid parasitic coupling, above all with flexural modes of oscillation. The same situation prevails in respect of the relationship between the length of the quartz and the length of the electrodes. Thus the ends of the bar will be immobilized and may be used as shown in FIG. 12 or in FIG. 13 in which 4 designates the quartz, 5 designates the electrode while 6 and 7 designate the mounting springs.

What we claim is:

1. A piezo electric resonator member of a dimension suitable for use in watches having a predictably stabile frequency around or, over 1 MHz, said resonator comprising a thickness shear AT cut rectangular bar of quartz crystal, said bar being elongated along the Z' axis of the quartz and having rectangular cross sections in planes parallel to the XZ' and XY' planes, said bar having metallized layers to serve as electrodes confined entirely to a relatively small, with respect to length, central zone of, but extending to the full width of, each of the surfaces running in the same direction as the XZ' plane, Y' and Z' being the rotated axes whereby the resonator vibrates in an energy trapping mode with vibrations being substantially confined to said relatively small central zone, the ends of the bar being employed as support points.

2. A piezoelectric resonator as set forth in claim 1 wherein the quartz is of uniform cross section along its length.

3. A piezoelectric resonator as set forth in claim 1 wherein the quartz varies in cross section along its length.

4. A piezoelectric resonator as set forth in claim 1 wherein the form of the quartz in planes parallel to the Z′Y′-plane exhibits greater thickness in the central zone than adjacent the ends.

5. A piezoelectric resonator as set forth in claim 4 wherein at least one of the surfaces bearing metallization is planar in its central zone and convexly rounded in its end zones.

6. A piezoelectric resonator as set forth in claim 3 wherein the form of the quartz in planes parallel to the Z′Y′-plane exhibits greater thickness in the central zone than adjacent the ends.

7. A piezoelectric resonator as set forth in claim 6 wherein at least one of the surfaces bearing metallization is planar in its central zone and convexly rounded in its end zones.

* * * * *